United States Patent [19]
Wolf

[11] Patent Number: 4,471,304
[45] Date of Patent: Sep. 11, 1984

[54] FLUID-POWERED ACTUATOR HAVING A CYLINDER WITH MAGNETIC FIELD DETECTORS THEREON AND A MAGNETIZED PISTON ROD

[75] Inventor: Henning Wolf, Nürtingen, Fed. Rep. of Germany

[73] Assignee: Festo-Maschinenfabrik Gottlieb Stoll, Esslingen, Fed. Rep. of Germany

[21] Appl. No.: 258,243

[22] Filed: Apr. 28, 1981

[51] Int. Cl.³ ................... G01B 7/14; H01L 43/06
[52] U.S. Cl. ................... 324/208; 324/251; 338/32 H
[58] Field of Search ........... 324/207, 208, 174, 175, 324/251; 338/32 H

[56] References Cited
U.S. PATENT DOCUMENTS

| | | | |
|---|---|---|---|
| 3,273,001 | 9/1966 | Baermann | 324/174 |
| 3,654,549 | 4/1972 | Maurer et al. | 324/208 |
| 3,742,243 | 6/1973 | Gamble | 324/174 |
| 3,945,459 | 3/1976 | Oishi et al. | 324/174 |

*Primary Examiner*—Gerard R. Strecker
*Assistant Examiner*—Walter E. Snow
*Attorney, Agent, or Firm*—Flynn, Thiel, Boutell & Tanis

[57] ABSTRACT

For producing readings representative of the position of a fluid-powered actuator, a magnetic position-sensing system is used which is out of contact with the actuator's ram and is completely united with the actuator's cylinder. The sensing system has a periodic magnetic field pattern of the ram itself and a number of magnetic field detectors placed in an end plate of the actuator clear of the ram's outer face. The true position of the ram within one period of the magnetization pattern is measured by electrical interpolation based on output signals of the different magnetic field detectors.

7 Claims, 10 Drawing Figures

FLUID-POWERED ACTUATOR HAVING A CYLINDER WITH MAGNETIC FIELD DETECTORS THEREON AND A MAGNETIZED PISTON ROD

FIELD OF THE INVENTION

The invention relates to an apparatus for sensing the relative positions of the ram and cylinder of a fluid-powered ram-cylinder actuator.

BACKGROUND OF THE INVENTION

For sensing the true position of a moving part of a machine, different sorts of electrical measuring systems have been put forward in the prior art such as precision potentiometers having wipers which are mechanically joined to the moving machine part, limit switches which are actuated by the moving machine part when it gets as far as certain positions, inductive pickups etc. Such sensing systems or pickups may, generally speaking, be used with fluid-powered ram-cylinder actuators. However, all parts fixed on the outside of an actuator are likely to be damaged or to become fouled in operation. Furthermore, such sensing systems or pickups are frequently so designed that they are readily damaged and do not have a long working life under rough conditions, for which the actuator may well as such be designed.

Furthermore, special purpose position pickups for ram-cylinder actuators have been put forward in the prior art which are completely within the cylinder or are part thereof so that the shortcomings noted are not to be feared. Such position pickups have air or electrical limit switches provided in the end walls of the cylinder so as to be actuated directly by the ram, which may be in the form of a piston and piston rod, when the ram comes to an end position, such pickups, however, having the shortcoming that they may not be used for sensing other positions of the piston.

SUMMARY OF THE INVENTION

For this reason, one of the purposes of the present invention is that of designing a pickup for use with a fluid-powered actuator, which is completely within the actuator while nevertheless making possible high-resolution sensing of a range of ram positions.

For effecting this purpose and other purposes, an apparatus according to the invention for sensing relative positions of the ram and cylinder of a fluid-powered ram-cylinder actuator is made up of a detector system on the cylinder responsive to a magnetic pattern on the ram.

In the pickup apparatus of the present invention, the ram, which will normally be the piston rod of a piston, has its own magnetization pattern in the form of a "scale", which has no effect whatsoever on the mechanical properties of the piston rod, which may be guided like a normal piston rod in the cylinder end plate of the actuator and glanded at this position. Because the "scale" is on the piston rod itself, there will be no danger of the pickup or sensing system and the piston rod getting out of step or out of synchronism after a long period of use because of shaking or vibration. The synchronized condition furthermore does not have to undergo adjustment and is produced once and for all by magnetizing the piston rod.

The magnetic field detectors or pickups acted upon by the magnetization pattern may, for example, be in the form of Hall generators or ferrite cores designed for the reading and writing of a magnetization pattern, such cores being small in size and marketed at a low price. They may readily be housed within the cylinder head having the piston rod running therethrough. Furthermore, such sensing systems may be positioned right on the cylinder head or end plate without the increase in the overall length being in any way important. For this reason, the positioning sensing system of the present invention does not make use of any parts running out beyond the general outline of the actuator and which, for this reason, might readily be damaged.

As one further development of the invention, the magnetization pattern is designed so as to undergo a periodic change in the length-direction of the piston rod or ram, this making possible particularly high resolution operation of the pickup system, because the magnetization may undergo great changes in the length-direction of the piston rod; this, in turn, being responsible for high levels of change in output signals of the magnetic field detectors. The rough position of the piston rod, that is to say the number of divisions by which the magnetization pattern has been moved, may readily be seen by using a counter controlled by the magnetic field detectors. Various positions of the piston rod within the periodicity interval of the magnetization pattern may readily be sensed from the amplitude and/or the phase position of the output signals of the magnetic field detectors.

As part of a further development of the invention, the magnetization pattern undergoes a sine-law change in the length-direction of the piston rod. With this development, it is particularly easy for the magnetization pattern to be produced on the piston rod and, furthermore, inbetween positions of the piston rod, that is to say within the magnetic field changeovers and within the periodicity interval, may be more simply determined by interpolation.

If the magnetization pattern is helical, a number of magnetic field detectors, acted upon by different fields, may be placed in one plane so that such a detector system may be completely housed even within a thin cylinder head or end plate. Furthermore, a helical magnetization pattern may be produced simply by coiling an electrical wire helically round the piston rod so that the magnetization pattern may be produced by using high enough direct current in the wire.

The magnetization pattern may have a number of ring-like magnetization fields placed one after the other in the axial direction so that the piston rod or ram may then be turned freely about its axis without having any effect on the pickup system, that is to say the same reading will be produced from the pickup without being dependent on the angular position of the piston rod about its axis.

The piston rod may be made of a material with poor magnetic properties or nonmagnetic material, which has a magnetizable material such as magnetizable filler within it and being made of a synthetic resin. The filler may be provided only in the region of the outer face part of the piston rod.

As a further possible design, the magnetization pattern may be on a strip of magnetizable material disposed in a groove in the piston rod.

On the other hand, if the piston rod is made of a synthetic resin with a magnetizable filler, at least near its outer face, the magnatization pattern may be produced on the piston rod simply, on a mass scale and at a lower price, because synthetic resin is used.

As a further development of the invention, the detector system may take the form of a number of magnetic field detectors which are out of line with each other in a direction around or along the piston rod or ram, the output signals of the magnetic field detectors going to a processing circuit which provides an output signal representative of the position of the piston rod. Furthermore, it is possible to have two magnetic field detectors which are out of line with each other in a direction around or along the piston rod by an amount equal to an integer multiple of half of the effective pitch of the magnetization pattern, their output signals being combined by the processing circuit for producing effective addition of the amounts of the signals. With such a system, the signal to noise ratio of the position sensing system is increased, while at the same time errors are averaged out which would otherwise be produced because the air gap between the respective magnetic field detectors and the face of the piston rod or ram has a tendency to be one-sided or unsymmetrical.

As part of a still further development of the invention, three magnetic field detectors are placed out of line in a direction round and/or along the piston rod axis by, in each case, one third of the effective pitch of the magnetization pattern, their output signals being used for powering coils which are angularly spaced from each other by 120° for producing a magnetic field which acts on a magnetic turning pointer which is pivotally supported within the field. This further development of the invention is a very simple way of producing an analog output signal for exact adjustment of the piston rod within the periodicity interval.

It is furthermore possible for the processing circuit, joined up with the Hall generators as magnetic field detectors, to take the form of a follow up circuit having: an error signal circuit for producing an error or deviation signal from the output signal of the detector system and a reference signal, an integrator for the error circuit, a display joined up with the output of the integrator, and curve networks for use with the separate detector units, designed inversely with respect to the change in the magnetization pattern in the length-direction of the piston rod with respect to the detector unit in question and whose output signals go to controlled current sources, with which the separate detector units are acted upon. With this further development of the invention, a particularly exact interpolation for getting the precise position of the piston rod within a periodicity interval of the magnetization pattern is made possible.

As part of a still further development of the invention, the error signal circuit takes the form of a comparator with a clock, said comparator producing output pulses at a first output terminal when the input signal is greater than the reference signal, and producing output pulses at a second output terminal when the input signal is smaller than the reference signal, the two output terminals of the error signal circuit being joined up with the count-forward terminal and, in the other case, the count-backward terminal of a forward and backward (or up and down) counter which serves as the integrator, and furthermore the data output of the forward and backward counter being joined up with digitally working curve circuits whose output terminals are joined up with the inputs of digital to analog transducers which are parts of the controlled current sources for a detector unit. Such a further development makes it particularly simple to get a high resolution reading and furthermore, in the case of this further development of the invention, digital circuits are used, making it possible for control circuits for the different groups of magnetic field detectors to be produced simply and very exactly.

In a still further development of the invention, only the terminals representative of the low levels of the data output of the backward and forward counter are joined up with the curve or characteristic circuits. With this further development of the invention, it is possible to make certain that the higher bits of the forward and backward counter are directly used for producing a reading of the rough position of the piston rod.

As part of a still further development of the invention, a further backward and forward counter for the rough position of the piston rod is joined up with one of the detector units by way of two-way switch or changeover switch under the control of the error signal circuit, so as to be dependent on the direction of motion of the piston rod, and a further display is joined up with the output of this further counter. In this further development of the invention, a reading for the rough position of the piston rod is directly produced by counting the periods or steps which have moved past, in one or the other direction, of the magnetization pattern. Because of this, there is a freer selection with respect to that count of the forward and backward counter which is in step with the period of the magnetization pattern.

BRIEF DESCRIPTION OF THE DRAWINGS

A full description of the invention will now be given by way of the working examples to be seen in the figures.

DETAILED DESCRIPTION

Figure 1:
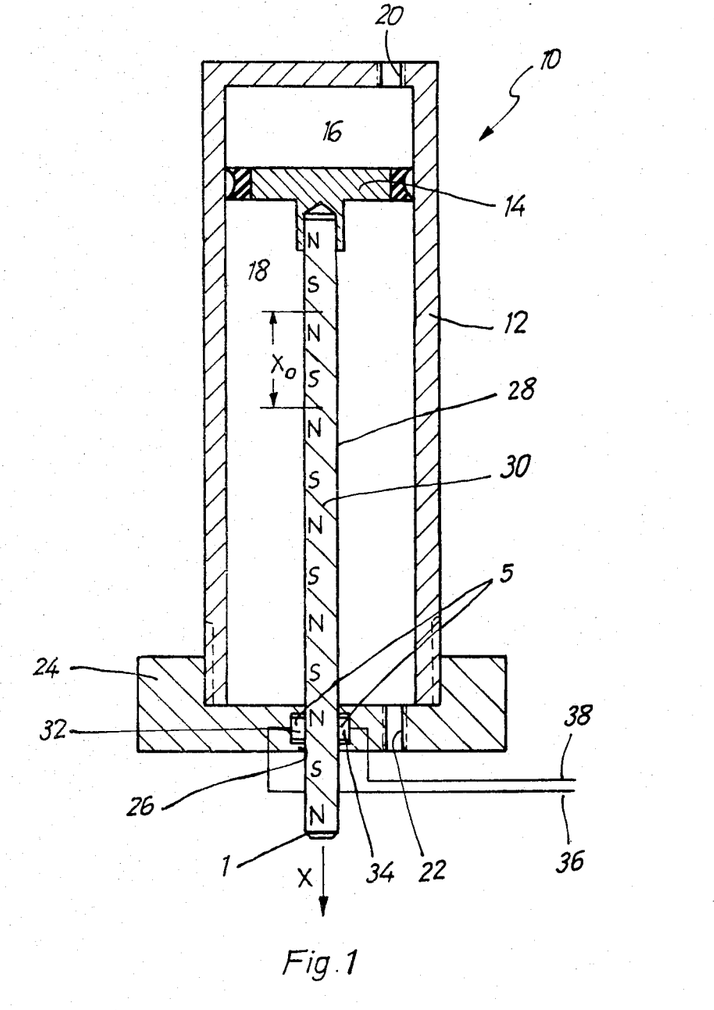
FIG. 1 is an axial section through a fluid-powered ram actuator which embodies the invention and has a ram in the form of a piston and piston rod, and a high resolution position sensing system or pickup made a part of, and housed within, the actuator.

In FIG. 1, the reader will see a double-acting fluid-powered actuator 10 with a cylinder 12 and a ram within it which, in the present working example, is in the form of a piston 14 and a piston rod 28, piston 14 separating the space inside the cylinder into two working spaces 16 and 18 which are connected by way of a control valve (not shown) with a high pressure source and low pressure source (not shown). A connection opening 20 or port is to be seen in the top end of the cylinder 12, which is made in one piece therewith. A connection opening 22 is to be seen in a cylinder head 24 or end plate which is screwed fluid-tightly onto the threaded lower end of cylinder 12.

Cylinder head 24 has a central opening 26 for the piston rod 28, which is joined with piston 14, the piston rod 28 being sealed glanded with respect to the head 24, although this is not to be seen in the present figure.

Piston rod 28 is made of a magnetizable material, for example steel or iron, and has a smooth surface. After machining the outer face of the piston rod 28, a helical magnetization pattern 30 is produced thereon by simply placing an electrical wire helically round the piston rod 28 and then using a direct current in the wire for effecting magnetization.

In the opening 26 of cylinder head 24, four cross-holes spaced by equal angles may be seen, each housing a Hall generator, of which two numbered 32 and 34 are to be seen in FIG. 1, each Hall generator being joined up by way of a four-core cable 36 and 38 for the supply current I and the Hall voltage $U_H$, the cables being joined up with a support circuit which is not shown in FIG. 1, but which will be made clear in full detail later in connection with FIG. 3.

It will be seen from FIG. 1 that half the lead or pitch of the helical magnetization pattern 30 is a little larger than the space taken up by the Hall generators 32 and 34 along the piston rod 28, this ensuring that the Hall generators 32 and 34, which are opposite to each other through the piston rod axis, each get an equal but opposite magnetic field.

Figure 2:
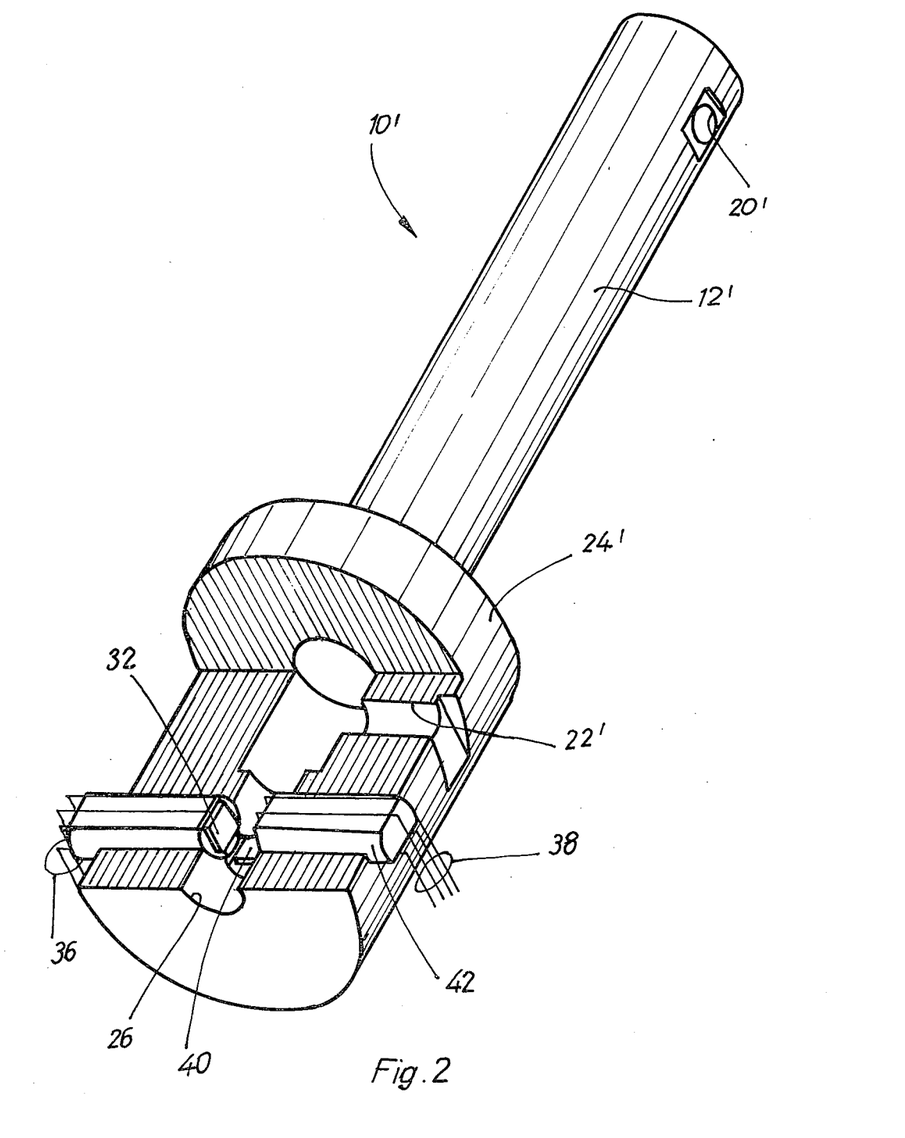
FIG. 2 is a perspective view, partly broken away, of a fluid-powered actuator according to the invention which shows more details of the magnetic field detector systenm housed within the actuator's head or end plate.

In FIG. 2, details of the placing of the Hall generators in the cylinder head 24 or end plate may be seen in the case of an actuator 12', which is a little different with respect to the placing of the connection openings 22' and 24' in FIG. 1.

Under Hall generator 32 a further Hall generator 40 will be seen which, in connection with a fourth Hall generator, not to be seen in FIG. 2, is placed on a line normal to the line running between the Hall generators 32 and 34, and it will be furthermore seen that at the back of the plate or wafer-like Hall generators themselves there is, in each case, a rod-like soft iron body 42 for making certain of the best possible magnetic field flux through the Hall generator in question.

In use, the piston rod 28 of the actuator will be stopped from turning about its axis because of its being joined up with a load, so that the magnetic field flux through the Hall generators is a direct measure of the position of the piston rod within a periodicity interval of the magnetization pattern 30.

Figures 3, 3A:
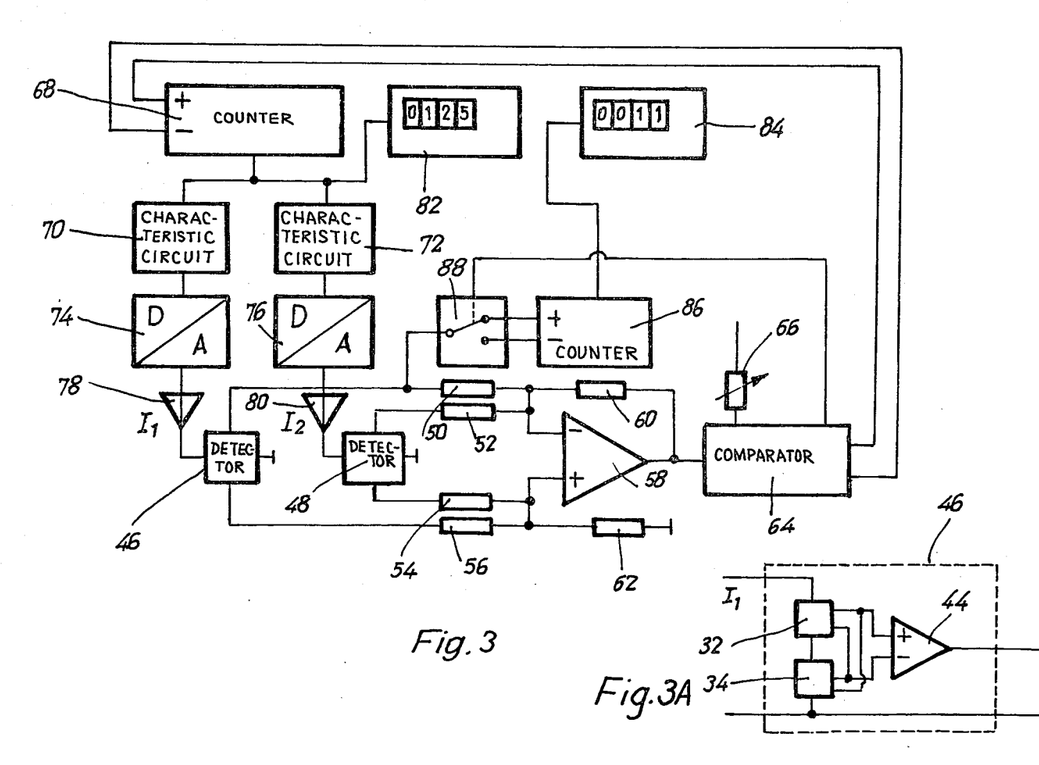
FIG. 3 is a schematic diagram of a processing circuit according to the present invention which may be joined up with the magnetic field detectors of the piston rod position sensing system of FIG. 1 or FIG. 2.
FIG. 3A is a schematic diagram of a detector unit which is a component of the circuit of FIG. 3.

In FIG. 3A the reader will see, by way of example of the Hall generators 32 and 34, how the generators are joined together with respect to Hall generators opposite to each other across the piston rod axis. With respect to their supply current $I_1$, the two Hall generators 32 and 34 are placed in series, that is to say the currents in them are the same in amplitude and the same in direction. Because the two Hall generators 32 and 34 are acted upon by local magnetic fields of opposite directions, that is to say their Hall voltage $U_H$ would be of opposite sign, such voltages are supplied to the inputs of a differential amplifier 44 which, for this reason, has in effect the function of summing the amount of the local magnetic fields of the magnetization pattern 30 at Hall generators 32 amd 34, small differences in the air space between the opposite Hall generators and the piston rod outer face being equalled out.

The two Hall generators 32 and 34, together with differential amplifier 44, take the form of a detector unit 46 or pickup, marked in FIG. 3 in its main part as a single block. A second detector unit 48 has, with respect to the circuit within it, the same structure as detector unit 46 but is joined up, however, with the two further Hall generators (one of which is Hall generator 40) whose connection line is normal to the connection line between Hall generators 32 and 34, so that they are out of line with respect to Hall generators 32 and 34 effectively by one quarter of the pitch of the magnetization pattern 30. The supply current for the second detector unit 48 is marked $I_2$ in the figure.

The output signals of the two detector units 46 and 48 go by way of resistors 50, 52, 54 and 56 to the input terminals of a differential amplifier whose output is joined up by way of a feedback resistor 60 with the inverting input terminal, the non-inverting input terminal of the differential amplifier 58 being grounded by way of resistor 62.

The size of the output signal of the differential amplifier 58 is directly a measure of the sum of the amounts of the magnetic fields through the Hall generators. This signal is, for this reason, furthermore a direct measure for the relative inching or small-distance displacement of piston rod 28 within a periodicity interval of the magnetization pattern 30 and, after processing in an analog computing circuit, which takes into account the details of the magnetization function along the piston rod, may be changed directly into an electrical position signal representative of motion of the piston rod. In place of such an analog computing circuit which, in general use, may frequently have shortcomings because of drift and nonexactness, in the present working example of FIG. 3, a driving or follow up circuit using, by and large, digital signals is used, which will now be made clear in more detail.

The output signal of the differential amplifier 58 goes to one input of a special-purpose comparator 64, which has a clock (not shown) or is joined up with a clock, its output being counting pulses at one of its two output terminals, such pulses being dependent on whether the signal coming from the differential amplifier 58 is smaller or larger than a reference signal controlled by potentiometer 66. As is generally the case with follow up circuits, it is furthermore possible to take steps to see that no count pulses are offered at anyone of the output signals of the comparator 64 when the difference between the output signal of the differential amplifier 58 and the reference signal is smaller than a given switching limit.

The output terminals of comparator 64 are joined up with the forward terminal or the backward terminal of a forward/backward or up/down counter 68, whose data output is joined up by way of two digital characteristic or curve circuits 70, 72 with two digital to analog converters 74, 76. The output signal of the last-named is used, after amplification in amplifiers 78, 80, for supplying current to the detector units 46 and 48.

At the data output of the forward/backward counter 68 there is furthermore a digital display or readout 82 which directly gives a high resolution reading for the position of the piston rod 28 within a periodicity interval of the magnetization pattern 30.

For reading the rough position of the piston rod 28, a second digital display 84 is present which is joined up with the data output of a further forward and backward counter 86, whose output terminals are joined up with the output terminals of a two-pole two-way switch 88, the position of switch 88 being dependent upon a further output signal of comparator 64 which is representative of the direction of motion of the piston rod 28. Such a signal has to be produced from the input signal and the reference signal in any case in comparator 64, which has a two-way switch on the same lines, between the clock and the output terminals, the forward/backward counter 86, for this reason, counting the upwardly running flanks of the magnetization pattern because the input terminal of two-way switch 88 is joined up with the output of one of the two detector units, namely detector unit 46.

The two characteristic or curve circuits 70 and 72 are, generally, so designed that, taking into account the exact axial form of the magnetization patterns 30 and the amount the separate detector units are angularly out of line, each gives a characteristic or curve which is generally inverse with respect to the magnetization form or curve. The curve or characteristic circuits 70 and 72 may be made up, for example, by the memory areas, having tables of the right sort, of a microprocessor and the arithmetic unit of the microprocessor.

The operation or driving and processing circuit noted in connection with FIG. 3 for the Hall generators is run as a follow-up system. Such follow-up systems may be responsible for an amplitude follow-up or follow-up as based on the phase condition.

For giving an account of the operation of the characteristic circuits 70 and 72, it is assumed that the two detector units 46 and 48 are out of line by one quarter of the period of the magnetization pattern, as is the case with the working example of FIGS. 1 and 2. In this case, the Hall voltage produced in the detector unit 46, $U_{H1}$, is given by $$U_{H1} = K \times I_1 \times \sin(2\ \text{pi}\ x/x_0)$$

in which

K = detector constant
$I_1$ = supply current of detector
x = motion of piston rod 28 from its starting position
$x_0$ = pitch of the magnetization pattern in the x-direction.

It will be seen from this that the Hall voltage $U_{H2}$ of the second detector unit 48, which is quite the same in design, will be given by $$U_{H2} = K \times I_2 \times \cos(2\ \text{pi}\ x/x_0).$$

Taking the count of the forward/backward counter 68 to be z and taking it that a count, representative of the pitch of the magnetization pattern, is $z_0$, the curve or characteristic of circuit 70 will be in line with the function $\sin^{-1}(2\ \text{pi}\ z/z_0)$ and that of circuit 72 will be in line with the function $\cos^{-1}(2\ \text{pi}\ z/z_0)$, from which it will be seen that the output signal of the differential amplifier 58

$$U_H = U_{H1} + U_{H2} = K \cdot (\sin^{-1}(2\ \text{pi}\ z/z_0) \times \sin(2\ \text{pi}\ x/x_0) + \cos^{-1}(2\ \text{ps}\ z/z_0) \times \cos(2\ \text{pi}\ x/x_0))$$

will be equal to the reference voltage 2 K— as fixed at potentiometer 66 only when $z/z_0 = x/x_0$.

In the working example to be seen in FIG. 3, selection of count $z_0$ is quite free so that the operation circuit may readily be changed for use with different pitches of magnetization pattern or piston rods. It is possible, for example, for count $z_0$ to be stored in a memory cell, from which it may be retrieved for working out the curve or characteristic.

If such flexibility with respect to the selection of the count $z_0$ is not necessary, the selection may be so made that it is representative of the largest number which may be produced with a given number of data output terminals. In this case the upper count limit of the forward/backward counter may be made larger than that necessary for counting up to the number $z_0$ and the higher value (most significant) bits of the counter may be used for getting a reading of the rough position of the piston rod. These higher-value bits of the data output of the forward/backward counter 68 are, in this case, then joined up with the characteristic circuits 70 and 72, while a single digital display or readout, taking the place of the displays 82 and 84, is joined up with all output terminals of the forward/backward counter 68.

Figures 4, 5:
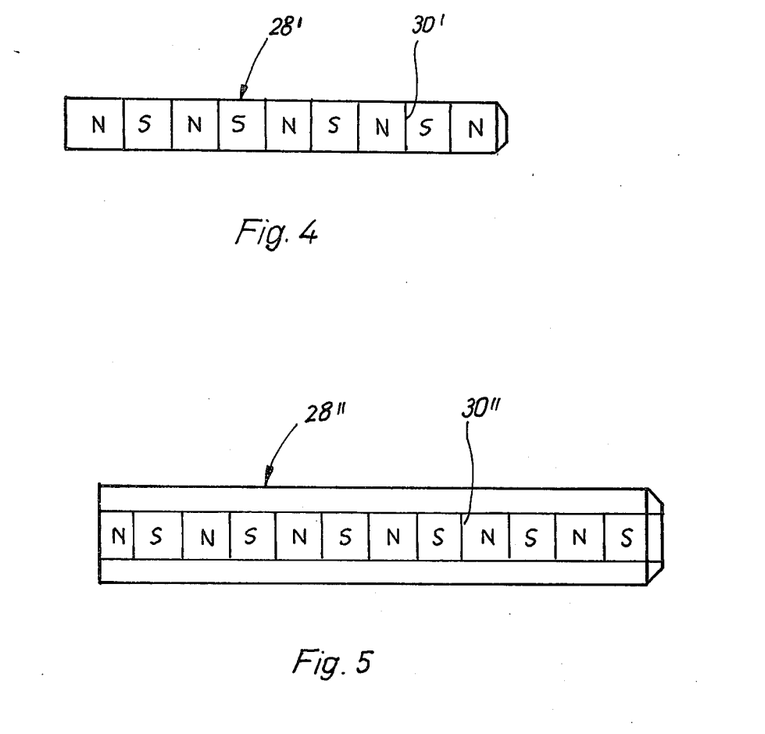
FIGS. 4 to 6 are diagrammatic views of piston rods with forms of magnetization patterns according to the invention which are different from that of FIG. 1.

In FIG. 4 a piston rod 28' with a different form of magnetization pattern 30' will be seen, which is radially symmetrical in respects. The magnetization pattern is made up of ring-like magnetization fields of opposite polarity placed one after the other in the axial direction.

FIG. 5 is a view of a piston rod 28'' in the case of which a magnetization pattern 30'' takes the form of a strip, running in the axial direction only and made up of magnetization fields having opposite polarities in turn.

Figure 6:
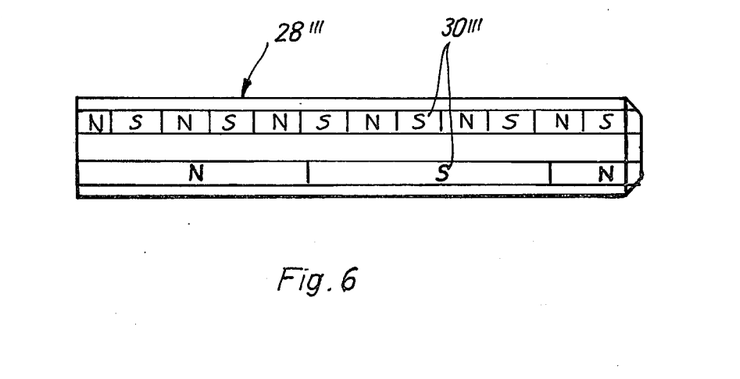

FIG. 6 is a view of a somewhat changed form of the pattern of FIG. 5, in which the piston rod 28''' has a magnetization pattern 30''' made up of two parallel strips, which, in each case, have magnetization fields of opposite polarity in turn placed in order, the periodicity of the two strips being made different in size so that a rough reading may be directly produced for the position of piston rod 28''' by using the magnetic field detectors in connection with the larger-periodicity strips.

Figure 7:
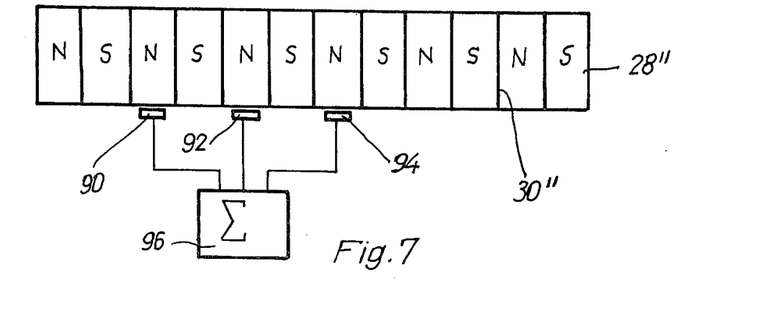
FIGS. 7 and 8 are diagrammatic views of magnetic field detector systems according to the invention which has a number of separate magnetic field detectors, the outputs of which are combined to produce a better signal to noise ratio and to overcome the effects of one-sided running or uneven clearances in the actuator.
Figure 8:
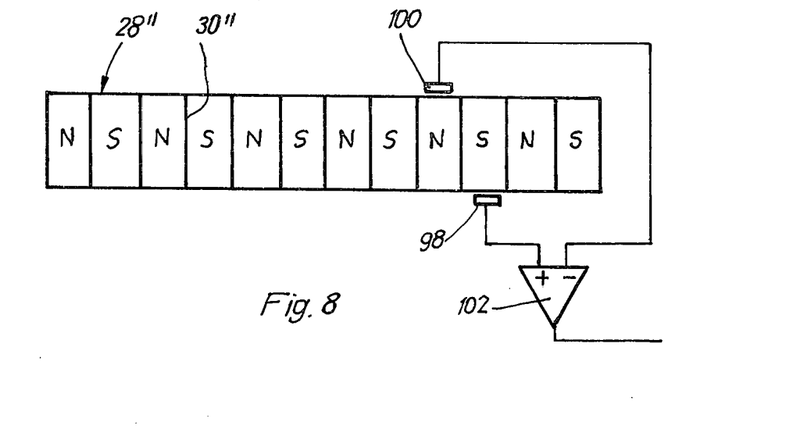

In FIGS. 7 and 8 the system is designed for producing a better signal-to-noise ratio of the position sensing system or pickup by increasing the number of magnetic field detectors used with the magnetization pattern, as shown on piston rod 28'' as an example.

In FIG. 7 three magnetic field detectors 90, 92 and 94 are placed out of line axially and with an angular spacing in angle between them, so as to be in line with the pitch of the magnetization pattern 30''. The output signals of the three magnetic field detectors 90, 92 and 94 acted upon by the same direct current, go to a summing amplifier 96, producing a representatively high output signal, from which statistical errors in the output signals of the separate magnetic field detectors may averaged out.

In FIG. 8, two magnetic field detectors 98 and 100 will be seen on opposite sides of the piston rod 28'' and placed out of line by half the pitch of the magnetization pattern 30''. They get the same supply current and their output signals are summed by a differential amplifier 102 so that, once again, there is a better signal-to-noise ratio and an averaging out of one-sidedness in the size of the air space between the magnetic field detectors and the opposite faces of the piston rod.

It will be clear that the measures of the working examples of FIGS. 7 and 8 may be used together or combined, care only being necessary to see that all magnetic field detectors are acted upon by the same supply current and that the output signals of one polarity undergo addition and the output signals of the other polarity undergo subtraction in producing the summed signal so that, in effect, there is an arithmetic summation of all signals.

Figure 9:
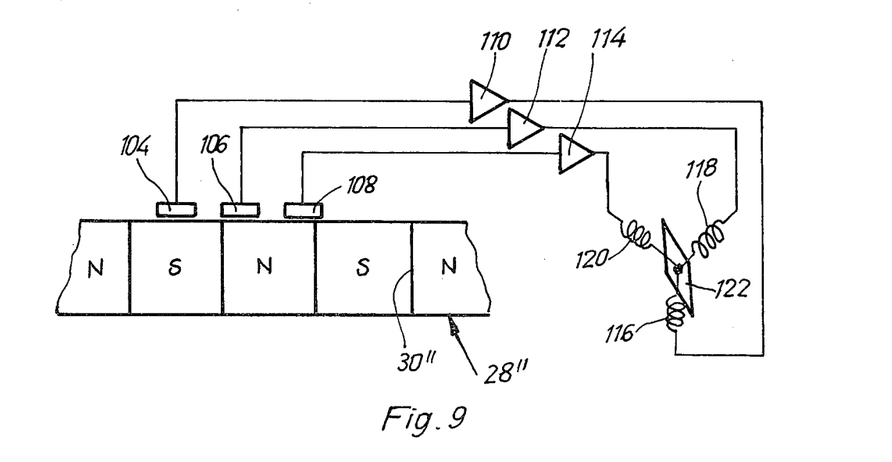
FIG. 9 is a schematic of a magnetic field detector system according to the invention for use in connection with a magnetization pattern on a piston rod, the output signal of the system being used for turning a pointer in a follow-up system.

FIG. 9 is a view of a particularly simple design of a position sensing system for the piston rod with a direct analog reading being produced with high resolution for the piston rod 28'', that is to say so as to give a precise determination of the piston rod position.

Three magnetic field detectors 104, 106 and 108 are out of line axially by a third of the pitch of the magnetization pattern 30''. Their output signals go by way of amplifiers 110, 112 and 114 to respective ends of three coils 116, 118 and 120 which have their other ends connected to each other and which are angularly spaced from each other about an axis by 120°. The magnetic turning field produced by these coils will have a direction directly representative of the exact position of the piston rod 28''. A magnetic needle or pointer 122 is movably supported in this turning field to give a high resolution reading of the exact position of the piston rod 28'' against a fixed scale (not shown).

The embodiments of the invention in which an exclusive property or privilege is claimed are defined as follows:

1. An apparatus which comprises: first and second members supported for relative movement in a direction; a magnetic scale on said first member extending approximately in said direction and having a plurality of spaced, alternate north and south magnetic poles therealong; at least two spaced magnetic field detectors provided on said second member at respective locations which are within the field of flux of said magnetic scale, said magnetic field detectors producing respective output signals which are proportional to the strength of the magnetic field at said respective locations; a fluid powered actuator which includes a cylinder, a piston supported in said cylinder for movement in said direction and a piston rod secured to said piston and extending substantially in said direction, said piston rod and cylinder respectively being said first and second members and said piston rod being made of a magnetizable material which is magnetized with said plurality of alternate north and south magnetic poles extending approximately in said direction to define said magnetic scale thereon; and a further magnetic scale on said piston rod extending parallel to said first-mentioned magnetic scale and including a plurality of spaced, alternate north and south magnetic poles therealong.

2. The apparatus according to claim 1, wherein the magnetic flux of each said magnetic scale on said piston rod varies sinusoidally therealong in said direction.

3. The apparatus according to claim 1, wherein said magnetic field detectors are Hall generators.

4. The apparatus according to claim 1, wherein the spacing between adjacent said poles of said further scale is substantially greater than the spacing between adjacent said poles of said first-mentioned scale.

5. An apparatus which comprises: first and second members supported for relative movement in a direction; a magnetic scale on said first member extending approximately in said direction and having a plurality of spaced, alternate north and south magnetic poles therealong; at least two spaced magnetic field detectors provided on said second member at respective locations which are within the field of flux of said magnetic scale, said magnetic field detectors producing respective output signals which are proportional to the strength of the magnetic field at said respective locations; and a fluid powered actuator which includes a cylinder, a piston supported in said cylinder for movement in said direction and a piston rod secured to said piston and extending substantially in said direction, said piston rod and cylinder respectively being said first and second members and said piston rod being made of a magnetizable material which is magnetized with said plurality of alternate north and south magnetic poles extending approximately in said direction to define said magnetic scale thereon; wherein said magnetic field detectors are respective Hall generators which are offset in said direction with respect to one another; including three said Hall generators which are each offset with respect to one another in said direction by distances equal to approximately one third of the distance between two adjacent said north magnetic poles, the output terminals of said Hall generators being connected to respective coils of an indicating device, said coils being arranged at respective locations which are angularly spaced about an axis by 120° with respect to each other; and wherein said indicating device has in the magnetic field produced by said coils a movably supported indicator which moves in response to variations in the magnetic fields produced by said coils.

6. The apparatus according to claim 5, wherein the surface of said piston rod is magnetized to have an elongate north pole extending helically thereon and an elongate south pole extending helically adjacent said elongate north pole, said plural alternate north and south poles of said magnetic scale being respective angularly aligned and axially spaced locations along said elongate north and south poles.

7. The apparatus according to claim 5, including four said Hall generators located at respective locations around said piston rod which are spaced by angular intervals of 90°.

* * * * *